United States Patent
Satoh (10) Patent No.: US 9,711,328 B2
(45) Date of Patent: Jul. 18, 2017

(54) METHOD OF MEASURING VERTICAL BEAM PROFILE IN AN ION IMPLANTATION SYSTEM HAVING A VERTICAL BEAM ANGLE DEVICE

(71) Applicant: Axcelis Technologies, Inc., Beverly, MA (US)

(72) Inventor: Shu Satoh, Byfield, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 14/972,334

(22) Filed: Dec. 17, 2015

(65) Prior Publication Data

US 2016/0189927 A1 Jun. 30, 2016

Related U.S. Application Data

(60) Provisional application No. 62/096,928, filed on Dec. 26, 2014.

(51) Int. Cl.
*H01J 37/36* (2006.01)
*H01J 37/30* (2006.01)
*H01J 37/317* (2006.01)
*H01J 37/304* (2006.01)

(52) U.S. Cl.
CPC ........ *H01J 37/3045* (2013.01); *H01J 37/304* (2013.01); *H01J 37/3171* (2013.01); *H01J 2237/244* (2013.01); *H01J 2237/24405* (2013.01); *H01J 2237/24542* (2013.01)

(58) Field of Classification Search
CPC ............... H01J 37/3045; H01J 37/3171; H01J 2237/244; H01J 37/026; H01J 37/05; H01J 2237/055; H01J 2237/0041
USPC ......... 250/396 R, 397, 492.1, 492.2, 492.21, 250/492.22, 492.23, 492.3
See application file for complete search history.

(56) References Cited

U.S. PATENT DOCUMENTS 7,361,914 B2  4/2008 Rathmell et al.
2010/0181499 A1* 7/2010 Vanderberg ........... H01J 37/026
250/492.3

* cited by examiner

*Primary Examiner* — Nicole Ippolito
(74) *Attorney, Agent, or Firm* — Eschweiler & Potashnik, LLC (57) ABSTRACT

An ion implantation system measurement system has a scan arm that rotates about an axis and a workpiece support to translate a workpiece through the ion beam. A first measurement component downstream of the scan arm provides a first signal from the ion beam. A second measurement component with a mask is coupled to the scan arm to provide a second signal from the ion beam with the rotation of the scan arm. The mask permits varying amounts of the ion radiation from the ion beam to enter a Faraday cup based on an angular orientation between the mask and the ion beam. A blocking plate selectively blocks the ion beam to the first faraday based on the rotation of the scan arm. A controller determines an angle and vertical size of the ion beam based on the first signal, second signal, and orientation between the mask and ion beam as the second measurement component rotates.

19 Claims, 8 Drawing Sheets

Fig. 8

METHOD OF MEASURING VERTICAL BEAM PROFILE IN AN ION IMPLANTATION SYSTEM HAVING A VERTICAL BEAM ANGLE DEVICE

REFERENCE TO RELATED APPLICATION

This application claims priority to and the benefit of U.S. Provisional Application Ser. No. 62/096,928 which was filed Dec. 26, 2014, entitled "METHOD OF MEASURING VERTICAL BEAM PROFILE IN AN ION IMPLANTATION SYSTEM HAVING A VERTICAL BEAM ANGLE DEVICE", the entirety of which is hereby incorporated by reference as if fully set forth herein.

FIELD OF THE INVENTION

The present invention relates generally to ion implantation systems, and more specifically to a system method for measuring a vertical ion beam profile in a scanned beam ion implantation apparatus having a device for measuring vertical beam angle.

BACKGROUND OF THE INVENTION

Ion implantation systems are mechanisms utilized to dope semiconductor substrates with dopants or impurities in integrated circuit manufacturing. In such systems, a dopant material is ionized and an ion beam is generated therefrom. The ion beam is directed at the surface of a semiconductor wafer in order to implant the wafer with the dopant element. The ions of the beam penetrate the surface of the wafer to form a region of desired conductivity, such as in the fabrication of transistor devices in the wafer. A typical ion implanter includes an ion source for generating the ion beam, a beamline assembly including a mass analysis apparatus for directing and/or filtering (e.g., mass resolving) the ions within the beam using magnetic fields, and a target chamber containing a workpiece to be implanted by the ion beam.

It is common for the workpiece being implanted in the ion implantation to be a semiconductor wafer having a size much larger than the size of ion beam. In most ion implantation applications, the goal of the implantation is to deliver a precisely-controlled amount of a dopant uniformly over the entire area of the surface of the workpiece or wafer. In order to achieve the uniformity of doping utilizing an ion beam having a size significantly smaller than the workpiece area, a widely used technology is a so-called hybrid scan system, where a small-sized ion beam is swept or scanned back and forth rapidly in one direction, and the workpiece is mechanically moved along the orthogonal direction of the scanned ion beam.

To achieve the uniform dose coverage to the entire area of the workpiece, the scan widths in both directions are set so that the entire part of ion beam completely leave the workpiece at the extremes of scans, often called "overscan". That is, the scan width is greater than the sum of the size of the workpiece plus the size of the ion beam in the dimension of the scan. However, in many cases, ion beam size in both or either direction are unknown, and quite often, the scan widths are set assuming an excessively large beam size. Such an assumption is safe in terms of providing uniform dose coverage, but it lowers the beam utilization efficiency, since the beam at overscan positions does not contribute to doping on the workpiece. Further, in some implantation situations, the size of ion beam is known to affect the doping characteristics (e.g., the dose rate effect) and it would be beneficial to know the size of the ion beam prior to the doping process.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The continuing trend in the electronics industry is to scale down electronic devices to produce smaller, yet more powerful devices that can perform a greater number of increasingly complex functions while consuming less energy. Semiconductors and integrated circuits (e.g., transistors, etc.) utilized in such devices are thus continually reduced in size. The ability to "pack" more of these devices onto a single semiconductor substrate, or portion thereof (known as a die) also improves fabrication efficiency and yield. To increase packing densities, features formed in and on a wafer as part of the semiconductor fabrication process may be reduced in size. It can be appreciated that the accuracy with which dopants can be added to select locations of semiconductor substrates plays an important role in successfully increasing packing densities. For example, there may be smaller margins for error with regard to implanting dopant ions within select locations of the semiconductor substrate given the reduced feature sizes.

Ion implantation systems, such as the so-called "Optima XE" system manufactured by Axcelis Technologies, Inc. or Beverly, Mass., do not have a capability of measuring a vertical profile or position of an ion beam. Typically, the vertical profile of an ion beam has not been measured, but the present disclosure presently appreciates that knowledge of such vertical profiles may be advantageous to optimize vertical overscan for the best utilization while ensuring the full coverage of the entire workpiece and controlling the dose rate of an implant if the process happens to be dose rate sensitive.

The above-mentioned Optima XE system, for example, is typically equipped with a vertical beam angle (VBA) measurement device. The present disclosure, however, provides VBA hardware and measuring software associated therewith that is advantageously configured to provide the vertical beam profile by provided an extended front mask of the VBA measurement device with a width that is comparable to a dose cup (e.g., a Faraday cup) positioned downstream of the VBA device. On the way to VBA measurement, a bottom edge (e.g., a straight edge) of the extended VBA mask cuts into the ion beam and the beam current behind the VBA device (e.g., beam current measured on the dose cup) starts decreasing.

A TILT motion can be made to be very precise during this transition to VBA measurement. In accordance with the present disclosure, by correlating the dose cup beam current change with the TILT angle, the vertical beam profile can be advantageously attained. To avoid fast switching between dose cup signal and VBA device signal, the signals from the two cups can be added together without disadvantageous consequences, since the VBA device and dose cup are not conventionally used simultaneously. The vertical beam profile signal can be advantageously separated via a controller according to TILT angle range (e.g., decrease of dose cup current with tilt angle and VBA signal, up and down of VBA signal with TILT angle, etc.).

A width of a VBA mask can advantageously provide the above measurements, wherein the VBA device signal and dose cup signal are connected or otherwise added together. Data gathering of dose cup signal and VBA device signal during the transition to VBA measurement, along with TILT angle measurement can be provided, as well as a separation of vertical beam profile signal and VBA according to TILT value. Profile signal processing can also be performed (e.g., differentiation with TILT position), and the resultant data may be displayed to an operator for use in controlling the system.

The present disclosure appreciates that utilization of the ion beam also plays an important role, as maximizing utilization of the ion beam provides throughput benefits, as well as energy and production benefits. Accordingly, the present disclosure provides mechanisms and techniques that facilitate more accurate ion implantations.

Thus, to the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

In semiconductor fabrication processing, semiconductor wafers or workpieces are implanted with charged particles or ions. The ions exhibit desired electrical characteristics due to their net positive or negative electrical charges. When utilized in association with semiconductor processing, such ionized materials are referred to as dopants because they "dope" or alter the electrical characteristics of the base or other layers that they are implanted into, causing the layers to have desired and predictable electrical behavior.

Figure 1:
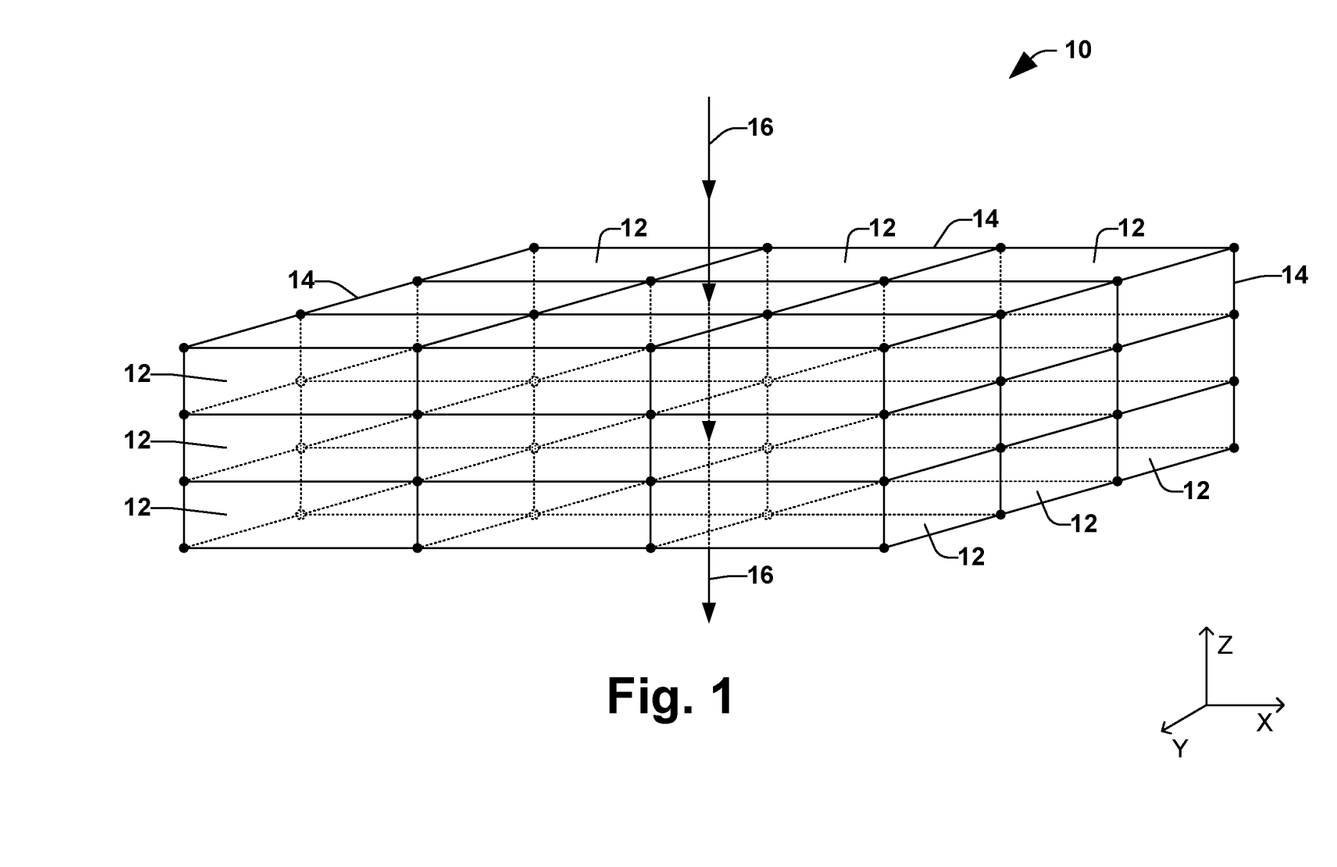
FIG. 1 is a perspective view of an example of a portion of a lattice structure wherein an ion beam is directed at the lattice structure substantially parallel to planes of the lattice structure.

The base layers or substrate are generally composed of silicon in a crystalline form. Materials are said to have a crystalline structure when their atoms are arranged in three dimensions in a regular manner, known as a crystalline lattice. By way of example, FIG. 1 illustrates a portion of a generic lattice structure 10 having a generally cubic configuration. In particular, in the example illustrated, the lattice structure 10 has twenty-seven (e.g., three by three by three) cells 12 that are generally cubical in shape. The lattice structure of the crystal exists within planes 14, that are substantially perpendicular to one another in the illustrated example (e.g., in the x, y, and z directions). It is to be appreciated, however, that lattice structures can come in any of a variety of different configurations and have any number of cells having any number of a variety of different shapes, such as diamond, pyramidal, hexagonal, etc.

One parameter of a semiconductor doping process is the angle of incidence between a beam of ions utilized to implant the dopant ions within the substrate and the internal lattice structure of the semiconductor material. The angle of incidence plays a role in a phenomenon known as channeling, among other things. In particular, as illustrated in FIG. 1, if the direction of a beam of dopant ions 16 (also called an ion beam) is substantially parallel to (vertical) planes 14 of the lattice structure, the beam may pass there-through—with less energy loss per unit length, because ions moving in the space between the planes have fewer collisions with crystal atoms.

As such, the ions may, among other things, be implanted deeply within the substrate (e.g., within a central channel within FIG. 1). It can be appreciated that other aspects can also affect channeling, such as the degree of amorphization of the substrate, the atomic mass of the substrate and the mass and/or energy of ions within the beam, for example. For instance, the greater the energy of the ions within the beam 16, the more likely the ions may be implanted deeply into the substrate.

Figure 2:
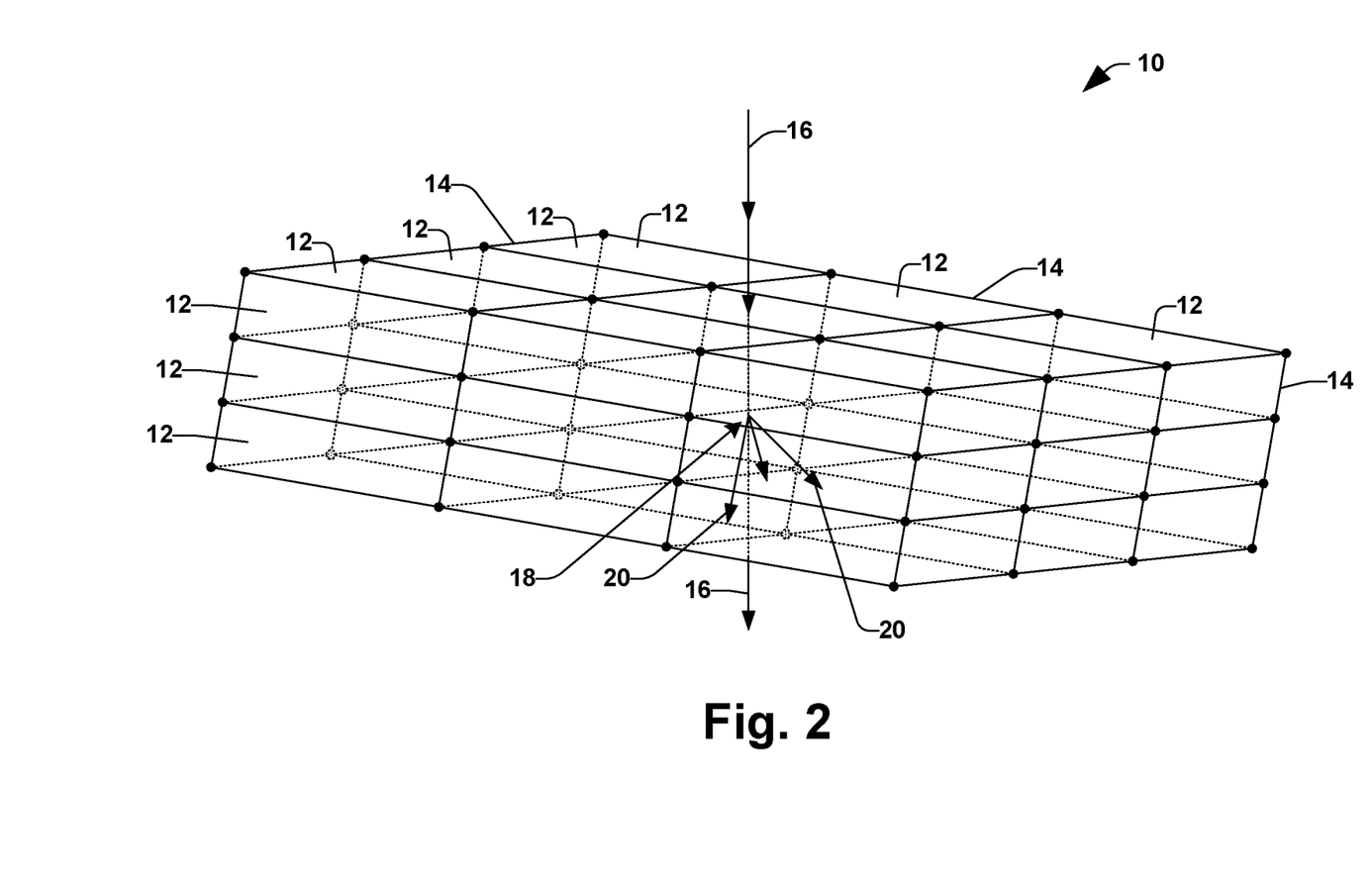
FIG. 2 is a perspective view of an example of a portion of a lattice structure, such as that depicted in FIG. 1, wherein an ion beam is directed at the lattice structure not substantially parallel to planes of the lattice structure.

In FIG. 2, for example, the direction of the ion beam 16 is not substantially parallel to (vertical) planes 14 of the lattice structure 10. As such, some of the ions within the ion beam 16 will likely impact portions 18 of the lattice structure and alter (e.g., damage) the lattice structure. In so doing, the ions will likely lose energy and slow down and/or be scattered from the original direction as indicated by arrows 20, thereby coming to rest in shallower portions of the workpiece. Accordingly, it may be desirable to orient the ion beam at a particular orientation relative to the lattice structure to mitigate channeling and/or localize doping.

In addition to channeling, shadowing effects also weigh in favor of developing a known implantation orientation. Shadowing generally results from the continuing trend in the electronics industry to scale down feature sizes to produce smaller, more powerful semiconductor devices. In certain instances, however, the spacings between features are reduced while the heights of the features may not be reduced. The generally fixed feature heights coupled with the shrinking spacings between features results in increased shadowing, whereby portions of the wafer that are to be doped receive little to no dopant ions. Such shadowing can become more exaggerated where an ion implantation angle is increased, such as to diminish channeling, for example.

Figure 3:
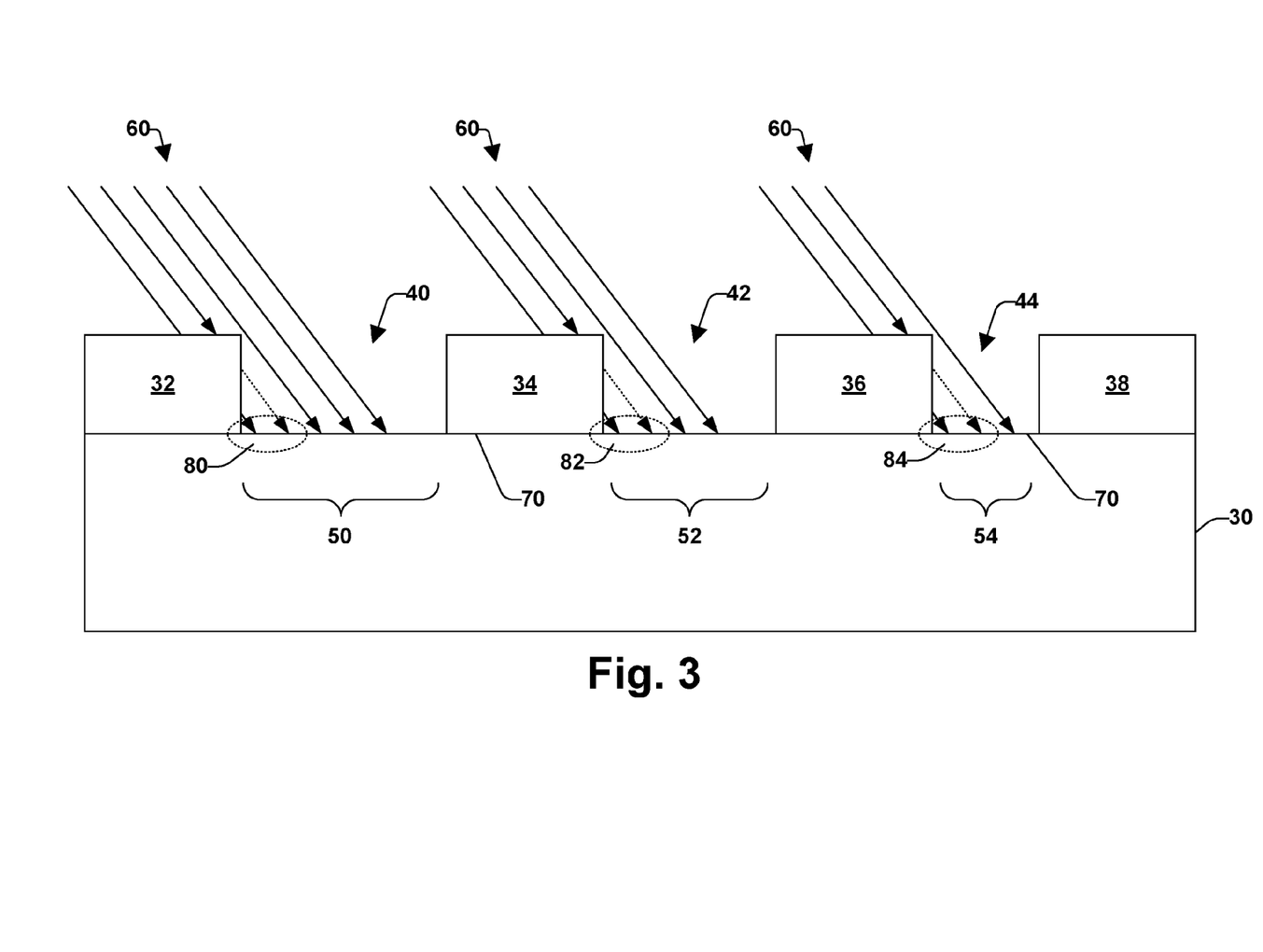
FIG. 3 is a cross-sectional view of a portion of a semiconductor substrate having features formed thereon that are separated by varying distances and that experiences shadowing effects to varying degrees during ion implantation.

Turning to FIG. 3, for example, a cross sectional view of a portion of a semiconductor substrate or wafer 30 has a plurality of features 32, 34, 36, 38 formed thereon, and respective spacings 40, 42, 44 are defined there-between. The features 32, 34, 36, 38 are formed out of a resist material and thus are all of substantially the same height. Areas 50, 52, 54 of the substrate 30 exposed by the spacings 40, 42, 44 are to be doped via ion implantation. Accordingly, one or more ion beams 60 are directed at the substrate 30 to perform the doping. The beams 60 are, however, oriented at an angle with respect to a surface 70 of the substrate 30 to mitigate channeling effects, for example. Some of the beams 60 thus have some of their ions blocked by portions (e.g., corners) of the features 32, 34, 36, 38. As such, regions 80, 82, 84 within the substrate areas 50, 52, 54 receive less than intended amounts of dopant ions. Such shadowing may leave some regions of the device improperly dosed. Accordingly, adverse effects associated with shadowing can become exaggerated depending upon implantation angles. It can thus be appreciated that it would be desirable to know an implantation orientation to be able to regulate shadowing effects and channeling, for example.

Figure 4:
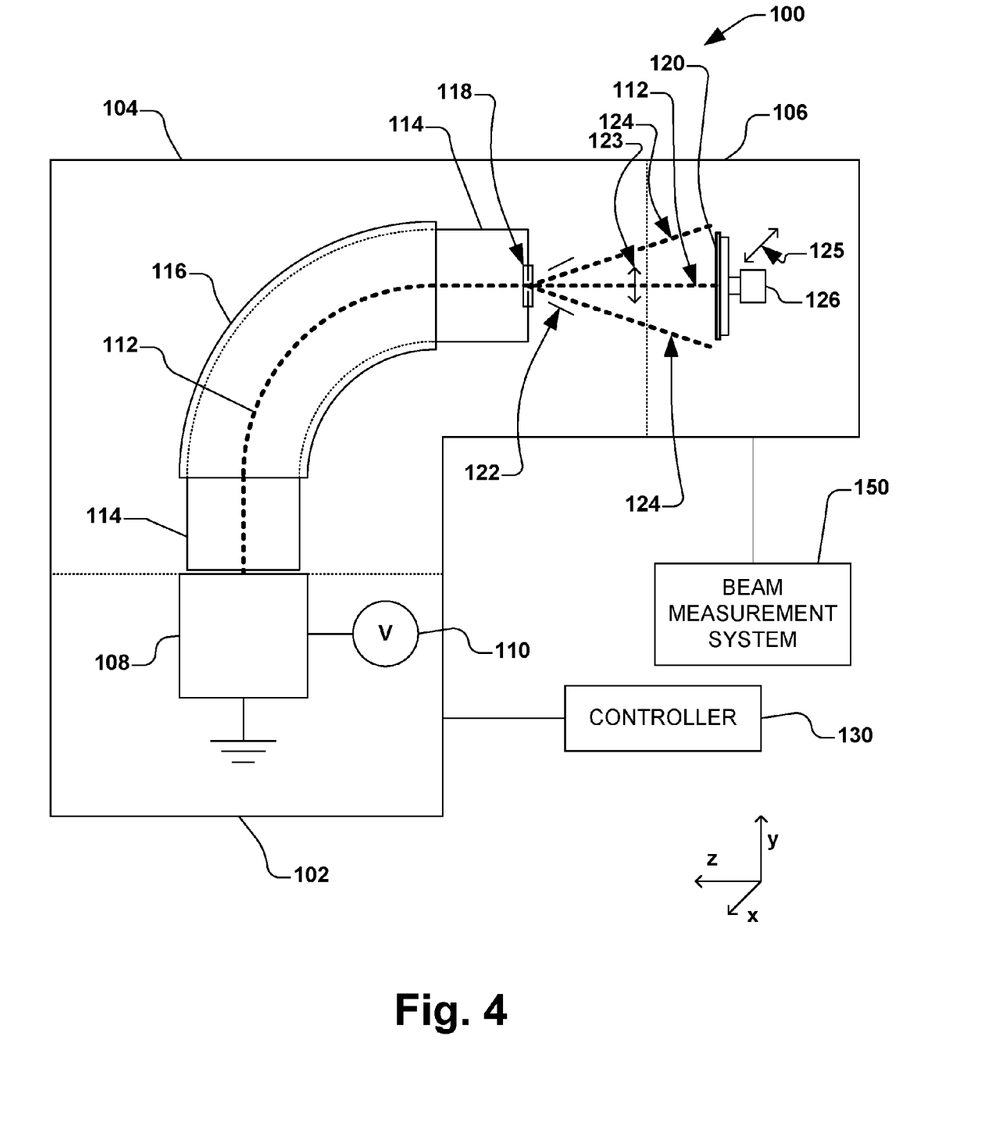
FIG. 4 illustrates an exemplary ion implantation system wherein one or more aspects of the present invention may be implemented.

Referring now to FIG. 4, an exemplary ion implantation system 100 is illustrated having a terminal 102, a beamline assembly 104, and an end station 106. The terminal 102, for example, comprises an ion source 108 powered by a high voltage power supply 110, wherein the ion source produces and directs an ion beam 112 through the beamline assembly 104, and ultimately, to the end station 106. The ion beam 112, for example, can take the form of a spot beam, pencil beam, ribbon beam, or any other shaped beam. The beamline assembly 104 further has a beamguide 114 and a mass analyzer 116, wherein a dipole magnetic field is established to pass only ions of appropriate charge-to-mass ratio through an aperture 118 at an exit end of the beamguide 114 to a workpiece 120 (e.g., a semiconductor wafer, display panel, etc.) positioned in the end station 106.

In accordance with one example, an ion beam scanning mechanism 122, such as an electrostatic or electromagnetic scanner (referred to generically as a "scanner"), is configured to scan the ion beam 112 in at least a first direction 123 (e.g., the +/−y-direction, also called a first scan path or "fast scan" axis, path, or direction) with respect to the workpiece 120, therein defining a ribbon-shaped ion beam or scanned ion beam 124. Furthermore, in the present example, a workpiece scanning mechanism 126 is provided, wherein the workpiece scanning mechanism is configured to selectively scan the workpiece 120 through the ion beam 112 in at least a second direction 125 (e.g., the +/−x-direction, also called a second scan path or "slow scan" axis, path, or direction). The ion beam scanning system 122 and the workpiece scanning system 126, for example, may be instituted separately, or in conjunction with one another, in order to provide the desired scanning of the workpiece relative to the ion beam 112. In another example, the ion beam 112 is electrostatically scanned in the first direction 123, therein producing the scanned ion beam 124, and the workpiece 120 is mechanically scanned in the second direction 125 through the scanned ion beam 124. Such a combination of electrostatic and mechanical scanning of the ion beam 112 and workpiece 120 produces what is called a "hybrid scan". The present invention is applicable to all combinations of scanning of the workpiece 120 relative to the ion beam 112, or vice versa. Further, a controller 130 is provided, wherein the controller is configured to control one or more components of the ion implantation system 100.

According to one exemplary aspect of present disclosure, a beam measurement system 150 is further provided. The beam measurement system 150, for example, is configured to determine one or more properties associated with the ion beam 112. A system and method for measuring the vertical beam angle (VBA) of the ions incident to the workpiece 120, as well as a calibration of said measurement to the crystal planes of the workpiece has been provided in a so-called "Optima XE" ion implantation system and commonly-owned U.S. Pat. No. 7,361,914 to Robert D. Rathmell et al., the contents of which are hereby incorporated by reference in its entirety. In some regards, the beam measurement system 150 resembles the beam measurement apparatus provided in Rathmell et al. However, one shortcoming of the system and methodology of Rathmell et al. is the absence of a capability of measuring a vertical size of the ion beam.

Accordingly, the ion implantation system 100 of the present disclosure is configured to not only measure the angle of incidence of the ion beam 112 with respect to the workpiece 120, but the ion implantation system of the present disclosure is further configured to determine a vertical size of the ion beam 112 that has not been previously measured.

Figure 5:
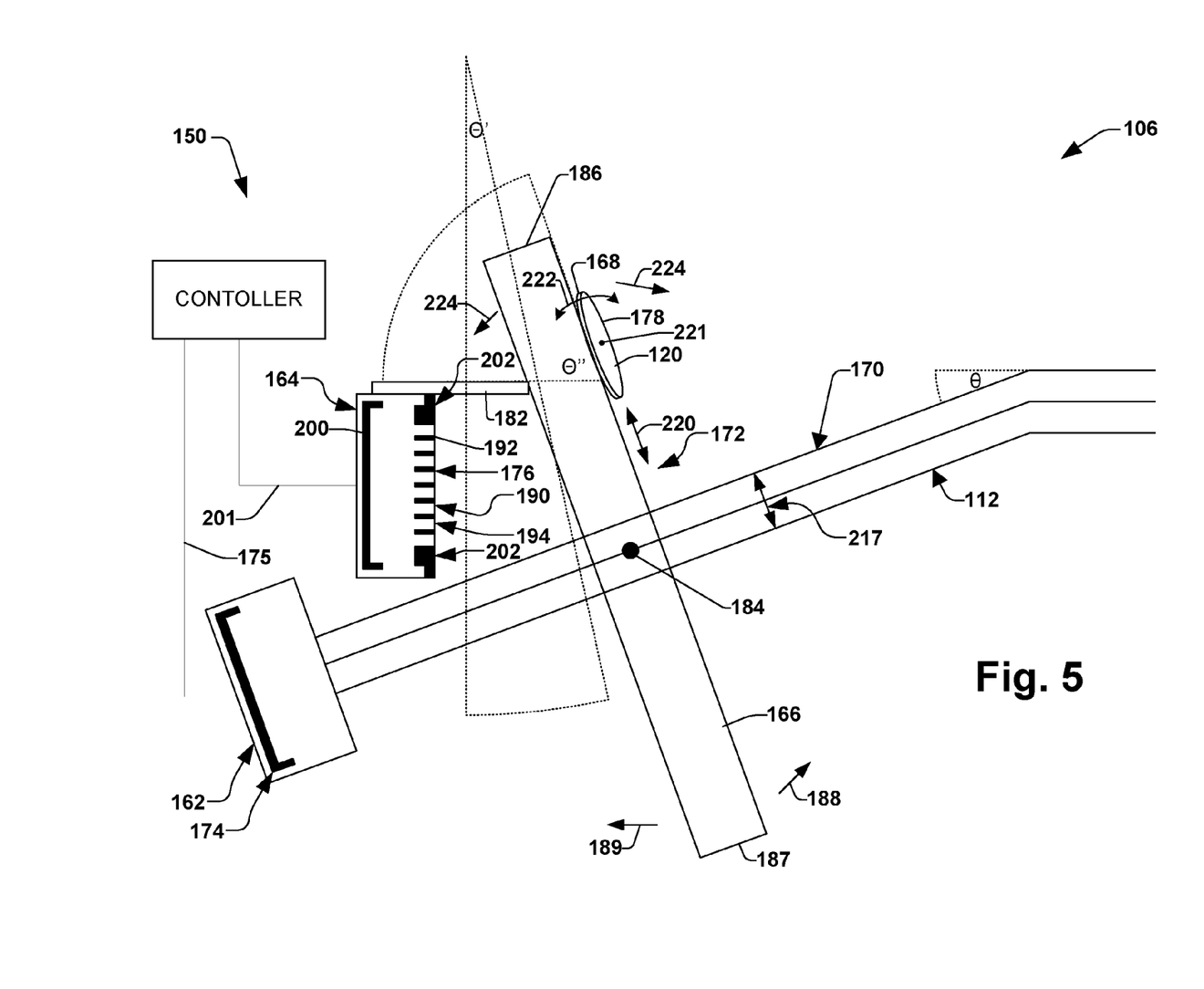
FIG. 5 is a schematic view illustrating an exemplary end station wherein various aspects are illustrated according to one or more aspects of the present invention.

A more thorough explanation of the operation and configuration of the beam measurement system 150 according to one or more aspects of the present invention will now be presented. FIG. 5 is a cross sectional view of an exemplary end station 106 and measurement system 150, wherein the measurement system comprises a first measurement component 162 and a second measurement component 164 configured to measure one or more properties (e.g., ion beam current).

In one example, the ion beam 112 is parallelized and bent, such as at a vertical bend angle θ of approximately 15 degrees, before being implanted into the workpiece 120 of FIG. 4. The ion beam 112 in the present example is a horizontal ribbon or a horizontally (e.g., in/out of paper direction) scanned, ribbon-like beam. The ion beam 112 may be bent, for example, such that energy contaminants do not impinge upon the workpiece 120. Electrostatic and/or magnetic techniques may be employed in bending the ion beam 112. However, the amount that the ion beam 112 is actually bent may vary slightly from what is intended. Utilizing the measurement system 150 as described herein, however, obviates the effects of these variations by allowing an orientation of the workpiece 120 to the beam to be accurately ascertained regardless of the trajectory of the beam 112.

The first measurement component 162, for example, is provided within the end station 106 downstream of a scan arm 166 upon which the workpiece 120 resides for ion implantation. A workpiece support 168 is in linear sliding engagement with the scan arm 166, wherein the workpiece support is configured to translate the workpiece through a path 170 of the ion beam 112 along an implantation plane 172. The first measurement component 162, for example, comprises a first faraday cup 174 positioned downstream of the scan arm along the path of the ion beam, wherein the first faraday cup is configured to provide a first signal 175 associated with ion radiation from the ion beam 112 incident thereto.

The second measurement component 164, for example, is mounted to a component within the end station 106, such as to the scan arm 166 upon which the workpiece 120 resides for ion implantation. In this manner, the second measurement component 164 is situated at a known orientation relative to the workpiece 120. For example, a surface 176 of the second measurement component 164 may be situated at an angle θ' relative to a surface 178 of the workpiece 120. The surface 178 of the workpiece, for example, resides on the implantation plane 172 during implantation. Similarly, the second measurement component 164 may be oriented so that a direction 180 normal to the surface 176 of the measurement component 164 is at a known angle θ" relative to the surface 178 of the workpiece 120. In any event, the orientation of the second measurement component 164 to the workpiece 120 is known so that the orientation of the ion beam 112 to the workpiece can be determined once the orientation of the ion beam to the second measurement component 164 is determined.

It will be appreciated that the second measurement component 164 is sufficiently attached so that its orientation to the workpiece 120 does not change, particularly as the scan arm 166, workpiece 120 and/or measurement component 164 are maneuvered. The second measurement component 164 may, for example, be mounted with one or more rigid bracket 182 to the scan arm 166. The orientation of the second measurement component 164 to the workpiece 120 may, however, be adjustable, such as by loosening a screw, nut, bolt or other clamping mechanism (not shown) and then re-securing the same once the second measurement component 164 has been adjusted.

In one example, in order to orient the second measurement component 164 relative to the beam 112, the second measurement component is maneuvered relative to the ion beam, such as by pivoting the scan arm 166 to which the second measurement component is attached about an axis 184 (e.g., a horizontal axis). Accordingly, an upper end 186 and a lower end 187 of the scan arm 166 are configured to rotate or rock back and forth in opposing directions 188 and 189. Thus, since the second measuring component 164 is fixedly attached to the scan arm 166, a rotation of the scan arm about the axis 184 may further selectively pass the second measurement component 164 through the ion beam 112. The second measurement component 164 is sensitive to ion radiation and detects various amounts of ion radiation depending upon the orientation between the beam and the measurement component.

Figure 6:
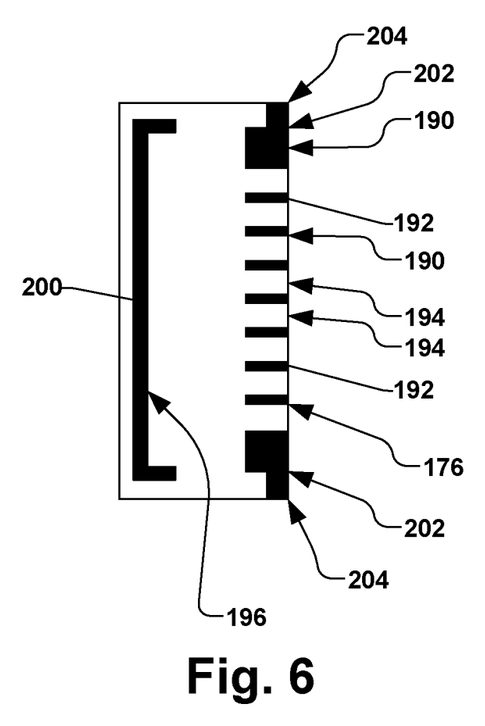
FIG. 6 is a schematic diagram illustrating an exemplary measurement component wherein one or more aspects of the present invention may be implemented.
Figure 7A:
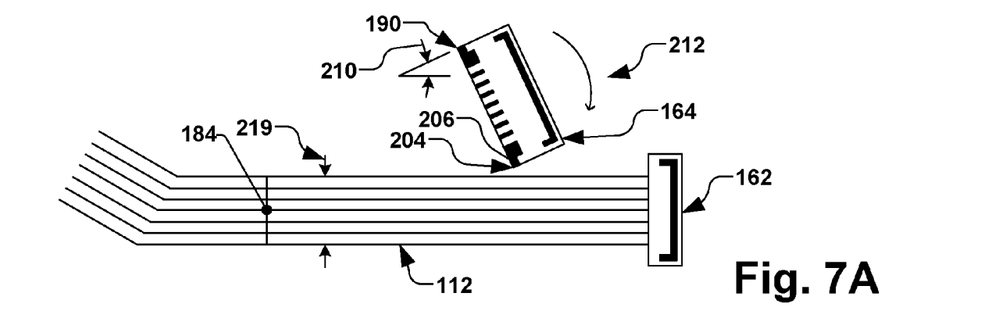
FIGS. 7A-7D illustrate an exemplary measurement of a vertical size of an ion beam according to one or more aspects of the present invention.
Figure 7B:
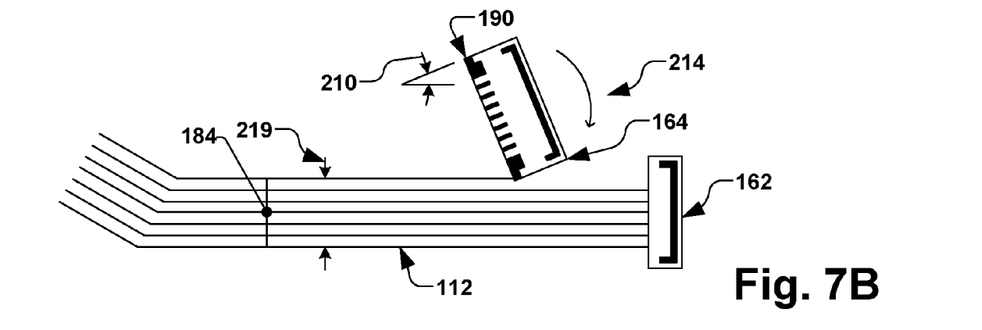
Figure 7C:
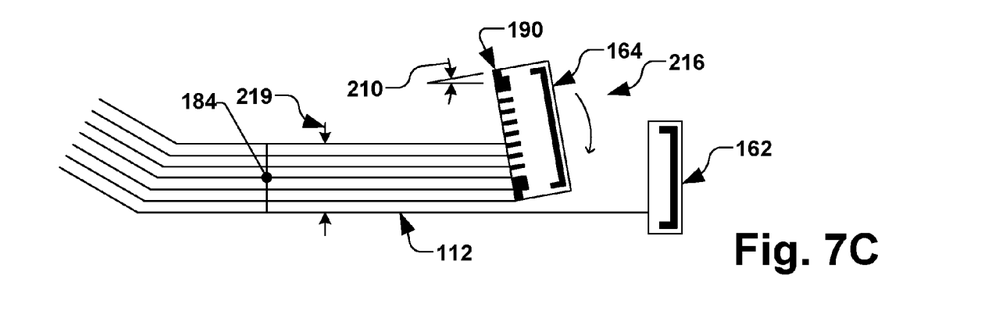
Figure 7D:
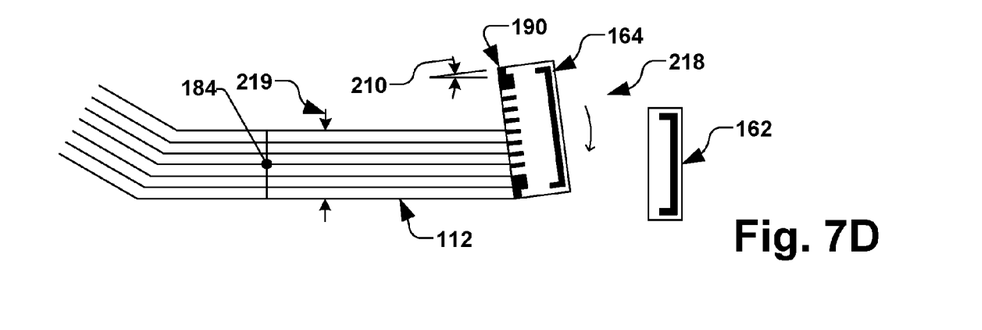

According to one exemplary aspect, the second measurement component 164 comprises a mask 190 which may be formed out of graphite, and comprises a plurality of tines 192 spaced apart by slots 194, as illustrated in greater detail in FIG. 6. The second measurement component 164, for example, comprises an ion sensitive portion 196, such as a faraday cup 200, wherein the ion sensitive portion is situated behind or downstream of the mask 190. The second faraday cup 200, for example, is configured to provide a second signal 201 of FIG. 5 associated with ion radiation from the ion beam 112 incident thereto concurrent with a rotation of the scan arm 166 about the axis 184. The tines 192, for example, have a length L and are separated by a distance D such that when the ion beam 112 is not co-axial with the slots 194 or normal 180 to the surface 176 of the second measurement component 164, some of the ion beam is blocked by the tines 192 and does not reach the radiation sensitive portion 196 of the second measurement component 164. In one example, the tines 192 have a length L of between about 5 and 50 millimeters and the slots 194 separate the tines 192 by a distance D of between about 1 and 15 millimeters.

The radiation sensitive portion 196 of the second measurement component 164, for example, may output a current indicative of the amount of ion beam 112 impinging thereon. Accordingly, since varying amounts of the ion beam 112 are allowed to pass through the mask 190 depending upon the relative orientation between the mask 190 and the (relatively stationary) ion beam 112, the current output by the second measurement component 164, and more particularly the radiation sensitive component 196, varies as a function of the alignment of the beam 112 to the second measurement component 164 (e.g., the beam angle). A peak current is thus indicative of the beam being aligned with the mask 190, or rather parallel to the normal 180 of the second measurement component 164. Since the orientation (angle) of the second measurement component 164 to the workpiece 120 is known, the orientation of the beam 112 to the workpiece 120 can be readily determined, such as by merely adding or subtracting an offset angle θ', for example. It will be appreciated that center of mass calculations and/or curve fitting can also be implemented where multiple current readings are taken while moving the second measurement component 164 through the beam 112 to determine when beam is directly impinging upon second measurement component 164. With a known orientation of the beam 112 to the workpiece 120, the workpiece 120 can be adjusted to achieve desired doping, such as in light of channeling and/or shading considerations, for example.

In accordance with the present disclosure, the mask 190 further comprises a blocking plate 202 positioned at one or more outboard locations 204 of the mask. The blocking plate 202, for example, is configured to selectively block the ion radiation from the ion beam 112 of FIG. 5 incident to the first measurement component 162 based on the rotation of the scan arm 166 about the axis 184. Accordingly, the first measurement component 162 comprises a faraday cup 208 operable to sense ion radiation from the ion beam 112.

In accordance with several aspects of the present disclosure, the scan arm 187 illustrated in FIG. 5 is configured to move around the axis 184, thereby moving the second measurement component 164 through the beam 112, whereby a vertical size 217 of the ion beam 112 is advantageously determined. FIGS. 7A-7D illustrate the motion of the second measurement component 164 through the ion beam 112 as the scan arm (not shown for purposes of clarity) rotates about the axis 184. For example, as a tilt angle 210 (e.g., associated with the offset angle θ') is varied from positions 212, 214, 216, and 218 of respective FIGS. 7A-7D, the outboard location 204 (e.g., the blocking plate 202) of the second measurement component 164 progressively intersects the ion beam 112, thus progressively blocking the ion beam from arriving at the first measurement component 162. In one example, the mask 190 is larger in height than the vertical size 217 of the ion beam 112. Thus, in accordance with the present disclosure, since the outboard location 204 of the second measurement component 164 is known as a strict function of the tilt angle 210, the vertical size 217 (and/or profile) of the ion beam 112 can be determined by simply analyzing the first signal 175 of FIG. 5 associated with ion radiation from the ion beam incident to the first measurement component 162 as the tilt angle is varied through the positions 214, 214, 216, and 218 of respective FIGS. 7A-7D.

Thus, in accordance with another exemplary aspect, the controller 130 of FIG. 5 is configured to determine an angle of the ion beam 112 as well as the vertical size 217 of the ion beam with respect to the implantation plane 172, wherein the determination is based, at least in part, on one or more of the first signal 175, second signal 201, and the relative orientation between the mask 190 and the ion beam as the faraday cup 200 of the second measurement component 164 rotates about the axis 184.

The workpiece 120 may, for example, linearly translate along the scan arm 166 (e.g., illustrated by arrow 220) and/or be able to pivot or tilt about a horizontal axis 221 (e.g., illustrated as arrows 222, 224 so as to desirably align the workpiece with beam 112 and/or to achieve one or more desired implantation angles for selective ion implantation into various locations on the workpiece. Additionally, the workpiece may be "twisted" about an axis normal to the surface at a center of the workpiece in order to achieve the desired orientation of the workpiece relative to the ion beam. It will be appreciated that such movements of the workpiece 120 can generally be performed precisely with finely tuned mechanics.

Figure 8:
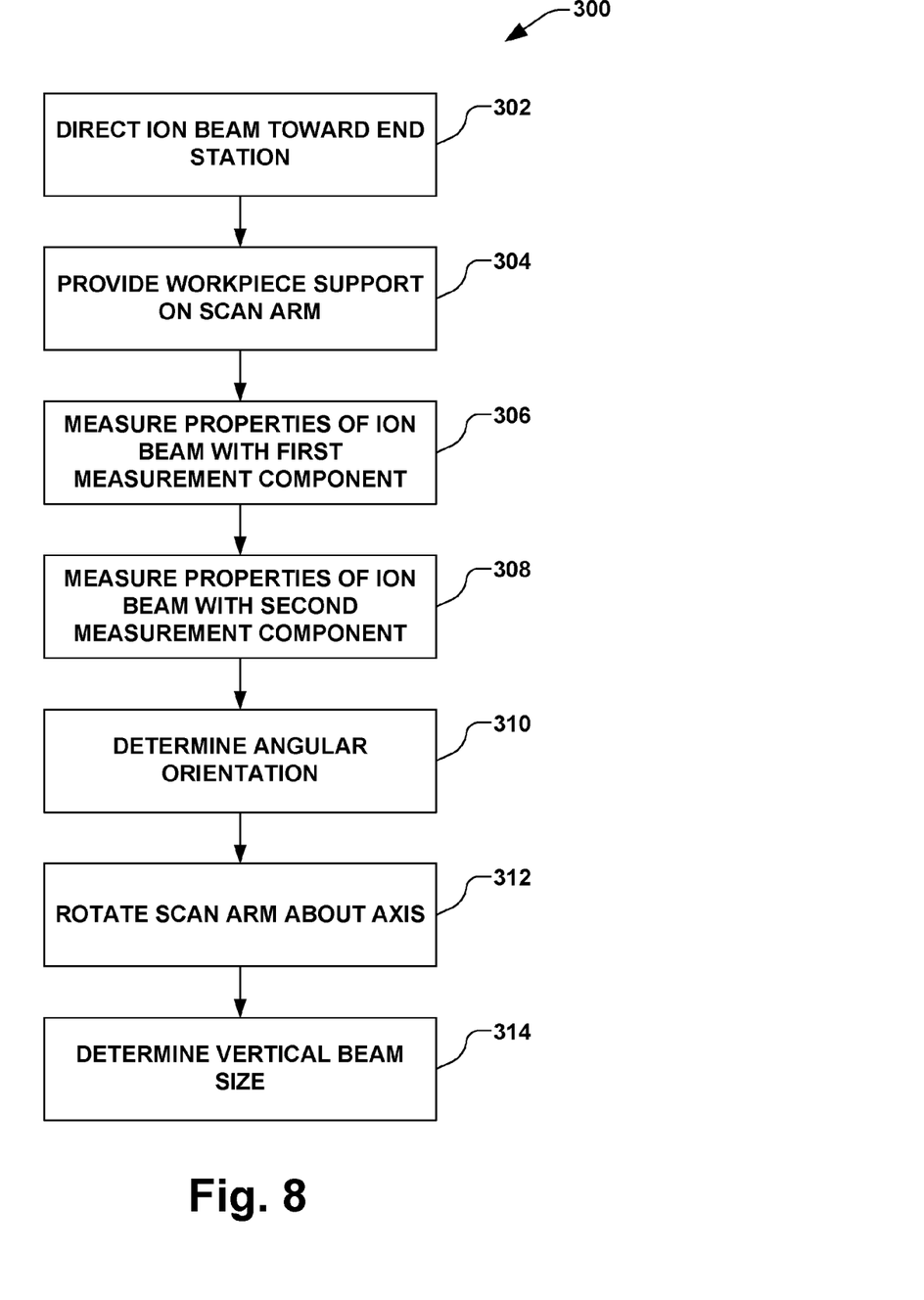
FIG. 8 is a method for profiling an ion beam according to one or more aspects of the present invention.

In accordance with yet another exemplary aspect, a method 300 for profiling an ion beam is illustrated in FIG. 8. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 8, in accordance with one example, the method 300 comprises directing an ion beam toward an end station in act 302. A workpiece support is provided in act 304, wherein the workpiece support is in linear sliding engagement with a scan arm, and wherein the workpiece support is configured to translate a workpiece through a path of the ion beam along an implantation plane. The scan arm, for example, is further configured to rotate about an axis.

In act 306, one or more properties of the ion beam are measured via a first faraday cup positioned downstream of the scan arm along the path of the ion beam, therein providing a first signal associated with ion radiation from the ion beam incident to the first faraday cup. In act 308, the one or more properties of the ion beam are further measured via a second faraday cup operably coupled to the scan arm, therein providing a second signal associated with ion radiation from the ion beam incident to the second faraday cup.

In act 310, a relative angular orientation between the mask and the ion beam is determined, such as by an encoder associated with the scan arm. In act 312, the scan arm is rotated about the axis. A mask is generally fixed to the second faraday cup and is positioned upstream of the second faraday cup, wherein the mask has a plurality of slits defined therein, and wherein the plurality of slits are configured to permit varying amounts of the ion radiation from the ion beam to pass therethrough to the second faraday cup based on the relative angular orientation between the mask and the ion beam. Further, a blocking plate is positioned at one or more outboard locations of the mask.

In act 314, an angle of the ion beam and a vertical size of the ion beam with respect to the implantation plane is determined, wherein the determination is based, at least in part, on one or more of the first signal, second signal, and the relative orientation between the mask and the ion beam as the second faraday cup rotates about the axis.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" as utilized herein simply means example.

What is claimed is:

1. A measurement system for an ion implantation system, the measurement system comprising:

a scan arm configured to rotate about an axis;

a workpiece support in linear sliding engagement with the scan arm, wherein the workpiece support is configured to translate a workpiece through a path of an ion beam along an implantation plane;

a first measurement component comprising a first faraday cup positioned downstream of the scan arm along the path of the ion beam, wherein the first faraday cup is configured to provide a first signal associated with ion radiation from the ion beam incident thereto;

a second measurement component comprising a second faraday cup operably coupled to the scan arm and a mask, wherein the second faraday cup is configured to provide a second signal associated with ion radiation from the ion beam incident thereto concurrent with a rotation of the scan arm about the axis, and wherein the mask is positioned upstream of the second faraday cup, wherein the mask is generally fixed with respect to the second faraday cup and has a plurality of slits defined therein, and wherein the mask is configured to permit varying amounts of the ion radiation from the ion beam to pass therethrough to the second faraday cup based on a relative angular orientation between the mask and the ion beam, wherein the mask further comprises a blocking plate positioned at one or more outboard locations of the mask, and wherein the blocking plate is configured to selectively block the ion radiation from the ion beam incident to the first faraday based on the rotation of the scan arm about the axis; and a controller configured to determine an angle of the ion beam and a vertical size of the ion beam with respect to the implantation plane, wherein the determination is based, at least in part, on one or more of the first signal, second signal, and the relative orientation between the mask and the ion beam as the second measurement component rotates about the axis.

2. The measurement system of claim 1, further comprising an angular measurement apparatus configured to determine an angular orientation of the scan arm about the axis, and wherein the controller is further configured to determine the angle of the ion beam and vertical size of the ion beam with respect to the implantation plane based on the angular orientation of the scan arm about the axis.

3. The measurement system of claim 2, wherein the angular measurement apparatus comprises an encoder operably coupled to the scan arm.

4. The measurement system of claim 1, wherein the controller is configured to determine the vertical size of the ion beam based on the second signal and an angular orientation of the scan arm about the axis.

5. The measurement system of claim 4, wherein the blocking plate is positioned at opposing ends of the mask, wherein the blocking plate is configured to pass entirely through the ion beam, therein selectively blocking the ion radiation from the ion beam incident to the first faraday CUP.

6. The measurement system of claim 4, wherein the blocking plate is positioned at a first end of the mask.

7. The measurement system of claim 1, wherein the blocking plate is fixed with respect to the mask and positioned at a predetermined distance from the axis.

8. The measurement system of claim 1, wherein the blocking plate is integral to the mask.

9. The measurement system of claim 1, wherein a height of the mask is greater than a height of the ion beam.

10. The measurement system of claim 1, wherein the mask and second faraday cup are fixed with respect to the scan arm.

11. The measurement system of claim 1, wherein the first faraday cup is rigidly coupled to a component of an end station, and wherein the axis is fixed with respect to the end station.

12. The measurement system of claim 1, wherein the ion beam comprises a horizontally-scanned ion beam.

13. The measurement system of claim 1, wherein the measurement component is oriented at a known relationship relative to the workpiece support.

14. The measurement system of claim 1, wherein the second measurement component blocks a portion of the ion beam from the first measurement component, and the controller is further configured to determine a vertical profile of the ion beam via the first signal and second signal.

15. The measurement system of claim 1, where the ion beam comprises one of a horizontal ribbon beam and a horizontally scanned beam, and wherein the controller is configured to determine a vertical bend angle of the ion beam.

16. The measurement system of claim 1, wherein the mask comprises a plurality of tines having a predetermine depth, and wherein the plurality of tines are separated from one another by a slit distance, therein defining the plurality of slits.

17. The measurement system of claim 16, wherein the slit distance is between about 1 and 10 millimeters, and wherein the predetermined depth is between approximately 5 and 50 millimeters.

18. The measurement system of claim 1, wherein the mask comprises graphite.

19. A method for profiling an ion beam, the method comprising:
   directing the ion beam toward an end station;
   providing a workpiece support in linear sliding engagement with a scan arm, wherein the workpiece support is configured to translate a workpiece through a path of the ion beam along an implantation plane, and wherein the scan arm is configured to rotate about an axis;
   measuring one or more properties of the ion beam via a first faraday cup positioned downstream of the scan arm along the path of the ion beam, therein providing a first signal associated with ion radiation from the ion beam incident to the first faraday cup;
   measuring the one or more properties of the ion beam via a second faraday cup operably coupled to the scan arm, therein providing a second signal associated with ion radiation from the ion beam incident to the second faraday cup;
   determining a relative angular orientation between a mask and the ion beam;
   rotating the scan arm about the axis, wherein the mask is generally fixed to the second faraday cup and is positioned upstream of the second faraday cup, wherein the mask has a plurality of slits defined therein, wherein the plurality of slits are configured to permit varying amounts of the ion radiation from the ion beam to pass therethrough to the second faraday cup based on the relative angular orientation between the mask and the ion beam, and wherein a blocking plate is positioned at one or more outboard locations of the mask; and
   determining an angle of the ion beam and a vertical size of the ion beam with respect to the implantation plane, wherein the determination is based, at least in part, on one or more of the first signal, second signal, and the relative angular orientation between the mask and the ion beam as the second faraday cup rotates about the axis.

* * * * *